(12) United States Patent
Sung et al.

(10) Patent No.: US 9,293,537 B2
(45) Date of Patent: Mar. 22, 2016

(54) HIGH PERFORMANCE STRAINED SOURCE-DRAIN STRUCTURE AND METHOD OF FABRICATING THE SAME

(71) Applicant: Taiwan Semiconductor Manufacturing Company, Ltd., Hsin-Chu (TW)

(72) Inventors: Hsueh-Chang Sung, Hsinchu County (TW); Ming-Huan Tsai, Hsinchu County (TW); Hsien-Hsin Lin, Hsinchu (TW); Chun-Fai Cheng, Tin Shui Wai (HK); Wei-Han Fan, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/261,570

(22) Filed: Apr. 25, 2014

(65) Prior Publication Data

US 2014/0319581 A1 Oct. 30, 2014

Related U.S. Application Data

(62) Division of application No. 12/956,090, filed on Nov. 30, 2010, now Pat. No. 8,709,897.

(51) Int. Cl.
| | |
|---|---|
| *H01L 29/78* | (2006.01) |
| *H01L 29/165* | (2006.01) |
| *H01L 21/265* | (2006.01) |
| *H01L 21/8234* | (2006.01) |
| *H01L 21/8238* | (2006.01) |
| *H01L 29/66* | (2006.01) |

(52) U.S. Cl.
CPC ........ *H01L 29/165* (2013.01); *H01L 21/26586* (2013.01); *H01L 21/823412* (2013.01); *H01L 21/823418* (2013.01); *H01L 21/823807* (2013.01); *H01L 21/823814* (2013.01); *H01L 29/66636* (2013.01); *H01L 29/7848* (2013.01); *H01L 29/66628* (2013.01)

(58) Field of Classification Search
CPC .......................... H01L 29/7848; H01L 29/165
USPC ..................... 257/192, 369, 288, 19, 18, 190;
438/285, 197, 225
See application file for complete search history.

(56) References Cited

U.S. PATENT DOCUMENTS

| | | | |
|---|---|---|---|
| 5,500,869 A | 3/1996 | Yoshida et al. | |
| 6,303,447 B1 | 10/2001 | Chhagan et al. | |
| 6,348,384 B1 | 2/2002 | Lin | |
| 6,605,498 B1 * | 8/2003 | Murthy et al. | 438/197 |
| 6,921,913 B2 * | 7/2005 | Yeo et al. | 257/18 |
| 7,071,065 B1 | 7/2006 | Xiang et al. | |
| 7,238,561 B2 | 7/2007 | Zhang et al. | |
| 7,253,086 B2 * | 8/2007 | Hall | 438/595 |
| 7,413,958 B2 | 8/2008 | Gunter et al. | |
| 7,553,717 B2 | 6/2009 | Chakravarthi et al. | |
| 7,601,983 B2 | 10/2009 | Ueno et al. | |
| 7,700,452 B2 | 4/2010 | Yu et al. | |

(Continued)

*Primary Examiner* — Sheng Zhu
(74) *Attorney, Agent, or Firm* — Haynes and Boone, LLP

(57) ABSTRACT

A method for forming a high performance strained source-drain structure includes forming a gate structure on a substrate and forming a pocket implant region proximate to the gate structure. Spacers are formed adjacent to the gate structure. A dry etch forms a recess with a first contour; a wet etch enlarge the recess to a second contour; and a thermal etch enlarges the recess to a third contour. The source-drain structure is then formed in the recess having the third contour.

20 Claims, 4 Drawing Sheets

(56) References Cited

U.S. PATENT DOCUMENTS

| | | |
|---|---|---|
| 7,791,064 B2 | 9/2010 | Shimamune et al. |
| 8,253,204 B2 | 8/2012 | Lee et al. |
| 8,455,324 B2 | 6/2013 | Fukuda et al. |
| 8,455,859 B2 | 6/2013 | Tsai et al. |
| 8,558,289 B2 | 10/2013 | Cheng et al. |
| 2006/0115949 A1 | 6/2006 | Zhang et al. |
| 2006/0138398 A1* | 6/2006 | Shimamune et al. ........... 257/19 |
| 2006/0231877 A1 | 10/2006 | Takenaka et al. |
| 2008/0237634 A1* | 10/2008 | Dyer et al. .................... 257/190 |
| 2009/0174002 A1 | 7/2009 | Ouyang et al. |
| 2009/0191679 A1* | 7/2009 | Ouyang et al. ................ 438/276 |
| 2011/0316046 A1* | 12/2011 | Chan et al. .................... 257/192 |
| 2012/0132957 A1 | 5/2012 | Sung et al. |

\* cited by examiner

HIGH PERFORMANCE STRAINED SOURCE-DRAIN STRUCTURE AND METHOD OF FABRICATING THE SAME

PRIORITY DATA

This application is a divisional application of U.S. application Ser. No. 12/956,090, filed Nov. 30, 2010, which is hereby incorporated by reference in its entirety.

BACKGROUND

In some semiconductor devices, the implant region is formed only by dry etching. A proximity limitation is imposed on the implant region by the thickness of spacers formed on the sides of gate structures. This proximity limitation reduces the overall size of the implant region. Thus, semiconductor device boosting suffers due to this proximity limitation. As such, there exists a need to reduce the proximity limitation effects of dry etching.

SUMMARY

The present disclosure is directed to both processing methods and semiconductor devices. In one embodiment, the present disclosure describes a method for forming a high performance strained source-drain structure. The method includes forming a gate structure on a substrate and forming a pocket implant region proximate to the gate structure. Spacers are formed adjacent to the gate structure. A dry etch forms a recess with a first contour; a wet etch enlarge the recess to a second contour; and a thermal etch enlarges the recess to a third contour. The source-drain structure is then formed in the recess having the third contour.

In another embodiment, the method includes providing a substrate with defined gate structures and forming pocket implant regions proximate to the gate structures. Spacers are formed adjacent to and on either side of the gate structures to overlie the pocket implant regions. A dry etch on the substrate forms a recess with a first contour in the pocket implant regions; a wet etch on the recess enlarges the recess to a second contour; and a thermal etch further enlarges the enlarged recess to a third contour. A source-drain structure is formed in the enlarged recess having the third contour by depositing a semiconductor material such as Silicon-Germanium (SiGe).

In one embodiment, the present disclosure describes a semiconductor device with a high-performance strained source-drain region. The device includes a substrate having a defined gate structure with spacers and a pocket implant region formed proximate to the gate structure. The device also includes a recess formed in the pocket implant region of the substrate via a dry etch, a wet etch, and a thermal etch. The device further includes a source-drain structure formed in the recess by deposition of a semiconductor material including Silicon-Germanium (SiGe).

In one embodiment, the present disclosure describes a semiconductor device having a substrate with a gate structure thereon. The device includes spacers overlying opposite sidewalls of the gate structure. The device includes source-drain features in the substrate at either side of the gate structure. The source-drain features have upper sidewalls with a first facet and lower sidewalls with a second facet, wherein the first facet is different from the second facet. In one aspect, the substrate comprises Silicon (Si), and the source-drain features comprise Silicon-Germanium (SiGe). In another aspect, the first facet is <110>, and the second facet is <111>.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion. It should be appreciated that like reference numerals are used to identify like elements illustrated in one or more of the figures.

DETAILED DESCRIPTION

Figure 1:
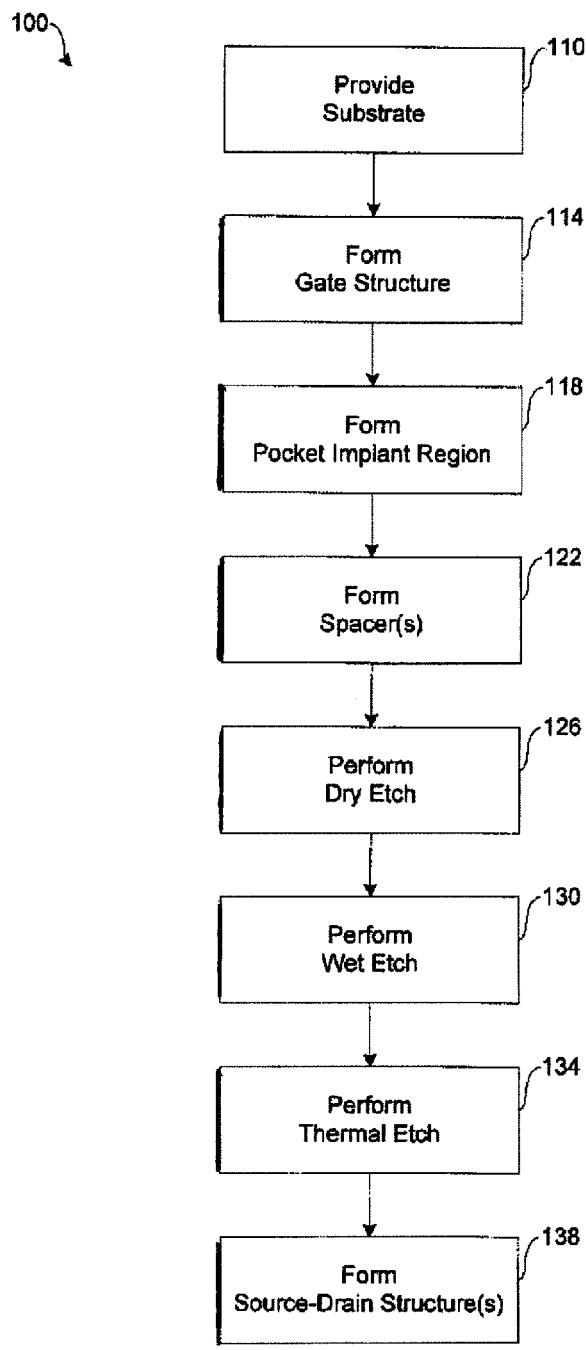
FIG. 1 shows a method for forming a source-drain structure, in accordance with an embodiment of the present disclosure.

It is understood that the present disclosure provides many different forms and embodiments, and that specific embodiments are provided only as examples. Further, the scope of the present disclosure will only be defined by the appended claims. In the drawings, the sizes and relative sizes of layers and regions may be exaggerated for clarity. It will be understood that when an element or layer is referred to as being "on," or "coupled to" another element or layer, it may be directly on, or coupled to the other element or layer, or intervening elements or layers may be present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Hereinafter, embodiments of the present invention will be explained in detail with reference to the accompanying drawings.

Embodiments of the present disclosure relate to source-drain structures including high performance strained source-drain structures and methods of fabricating the same.

Embodiments of the present disclosure provide device boosting and drain-induced barrier lowering (DIBL) control by a novel strain source drain (SSD) profile formation. In one aspect, device boosting is provided by the SSD profile due to a strain that is closer to the channel. Embodiments of the present disclosure utilize pre-bake of an epitaxial layer (EPI) deposition process and etching a self-aligned lightly doped drain (LDD) area to form the SSD profile.

FIG. 1 shows a method 100 for forming a source-drain structure, in accordance with an embodiment of the present disclosure. FIGS. 2A-2E shows a process flow for forming a source-drain structure, in accordance with an embodiment of the present disclosure. In one implementation, the method 100 of FIG. 1 and corresponding process flow of FIGS. 2A-2E may be utilized for fabrication of high performance strained source-drain structure.

Figure 2A:
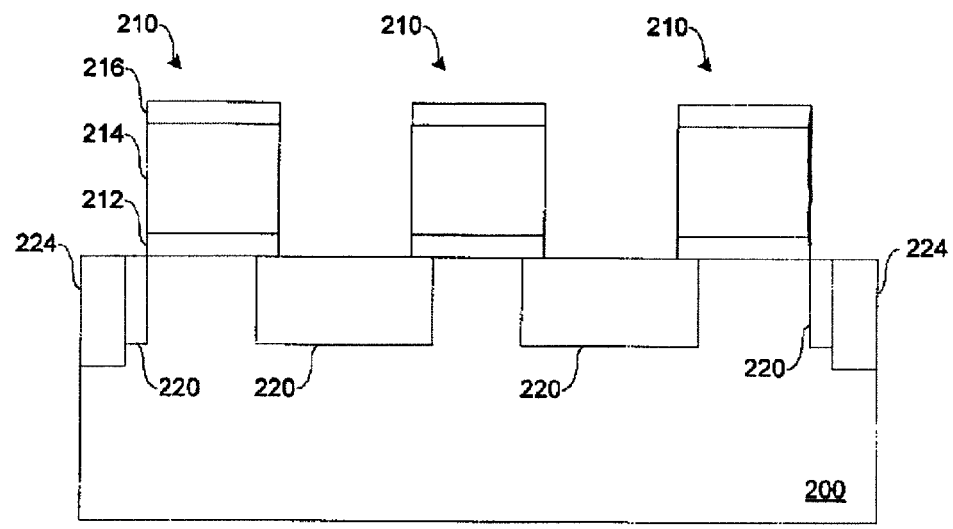
FIGS. 2A-2E shows a process flow for forming a source-drain structure, in accordance with an embodiment of the present disclosure.

Referring to FIG. 1, a substrate is provided (block 110) and a gate structure is formed on the substrate (block 114). In one embodiment, as shown in FIG. 2A, a substrate 200 comprising a semiconductor material, such as silicon (Si), is provided, and one or more gate structures 210 are formed on the substrate 200. The gate structures 210 include a gate oxide layer 212, a poly-silicon (poly-Si) layer 214, and a mask layer 216, such as hard mask layer for photo-lithographic processing. In one aspect, the gate layers 212, 214, 216 are formed on the substrate 200, and a poly-Si etch is performed to define the gate structures 210. In other embodiments, the substrate 200 may comprise a sapphire substrate, a silicon-carbide (SiC) substrate, a gallium-nitride (GaN) substrate, or various other composite substrates, without departing from the scope of the present disclosure.

Referring to FIG. 1, pocket implant regions are formed in the substrate proximate to the gate structures (block 118). In one embodiment, as shown in FIG. 2A, one or more pocket implant regions 220 are formed in the substrate 200 proximate to the gate structures 210. The pocket implant regions 220 comprise semiconductor dopant material, such as Arsenic (As), Phosphorus (P), or some combination of As and P (AsP). In one aspect, the pocket implant conditions may include 20~80 KeV, 1e12~1e14 atoms/cm2, and 15~45 tile angle. In another aspect, the pocket implant regions 220 may not include implantation of LDD (Light Doped Drain) of Boron (B) or Boron-Fluorine ($BF_2$). In one embodiment, the substrate 200 includes one or more shallow trench isolation (STI) structures 224 formed therein for electrical isolation.

Figure 2B:
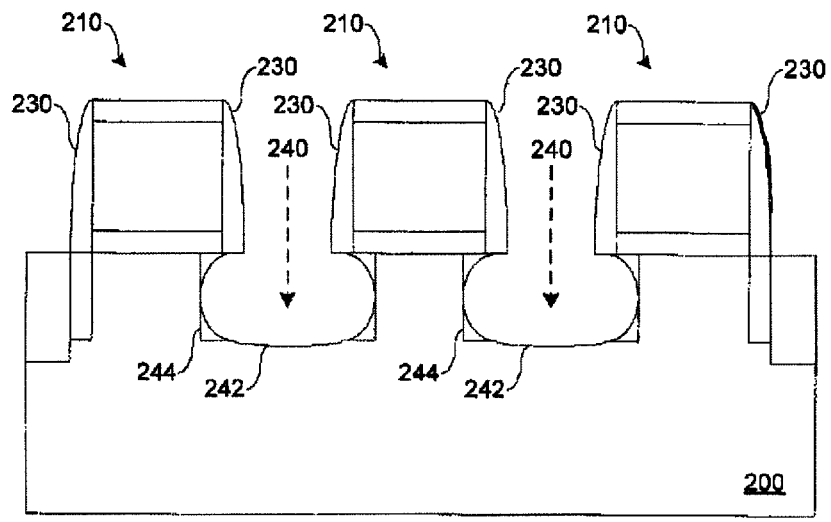

Referring to FIG. 1, spacers are formed adjacent to the gate structures (block 122). In one embodiment, as shown in FIG. 2B, one or more spacers 230 are formed adjacent to and on either side of the gate structures 210. The spacers 230 comprise a dielectric material, such as Silicon-Nitride (SiN), various oxide materials, or some combination of SiN and some oxide material. In one aspect, spacer deposition of SiN or OX/SiN is adapted to control proximity. SiN may include furnace SiN, ALD SiN, or PE SiN. Oxide may include thermal oxide, ALD oxide, or PEALD oxide. In various aspects, thickness of SiN may range from about 50 A to about 200 A, and thickness of Oxide may range from about 15 A to about 50 A.

Referring to FIG. 1, a dry etch is performed to form recesses in the implant regions of the substrate (block 126). In one embodiment, as shown in FIG. 2B, a dry isolation (ISO) etch 240 is performed to form one or more recesses 242 with a first contour or shape in the one or more pocket implant regions 220 of the substrate 200. In one aspect, the dry ISO etch is performed to define proximity. The ISO etch gas may comprise CF4/C12/NF3/SF6/He, and the depth of the recesses 242 may range from about 200 A to about 500 A. In one embodiment, the dry ISO etch 240 may form one or more pocket implant regions 244 for anti-punch through control.

Figure 2C:
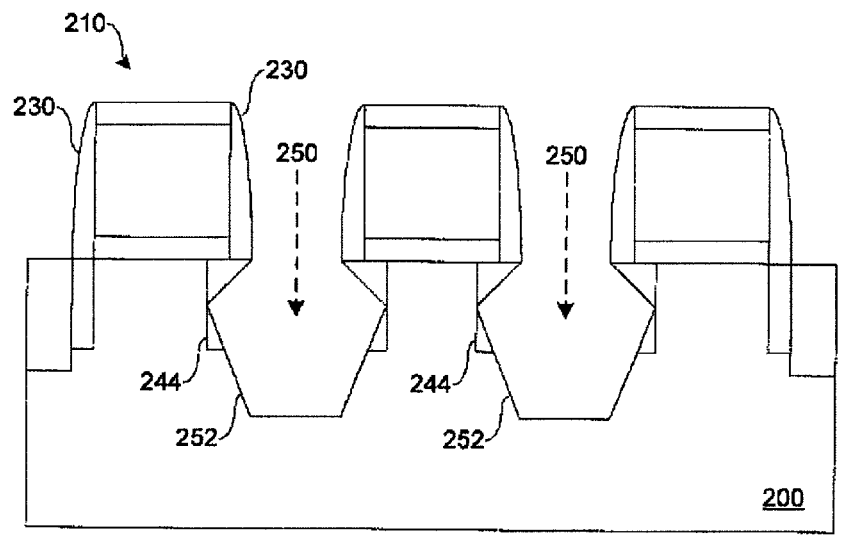

Referring to FIG. 1, a wet etch is performed to enlarge the dry etch recesses formed in the substrate (block 130). In one embodiment, as shown in FIG. 2C, a wet etch 250 by Tetra-Methyl-Ammonium Hydroxide (TMAH) is performed to enlarge the dry etch recesses 242 to form enlarged recesses 252 with a second contour or shape in the pocket implant regions 220 of the substrate 200. The wet etch by TMAH is utilized to form a (111) plane. In one aspect, the TMAH condition may include 20~100° C. and 1~30% concentration, and depth of the enlarged recesses 252 may range from about 400 A to about 800 A after TMAH etching.

Figure 2D:
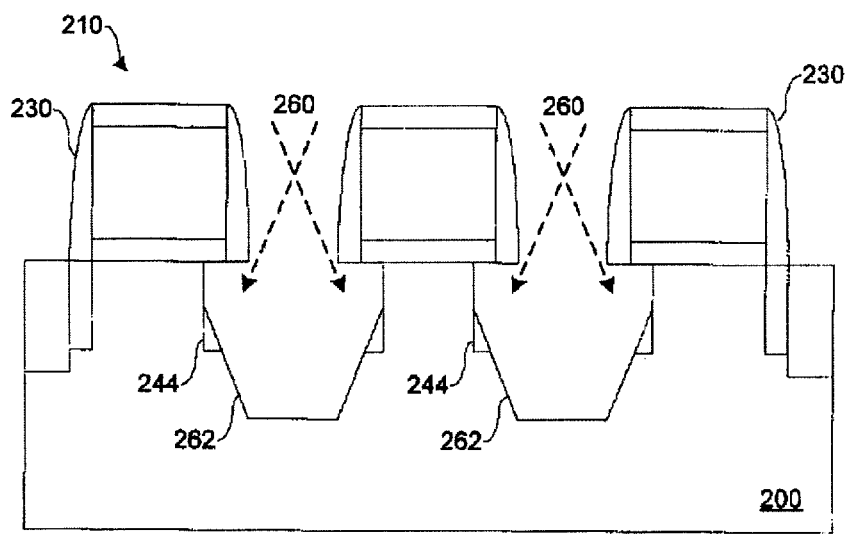

Referring to FIG. 1, a thermal etch is performed to enlarge the wet etch recesses formed in the substrate (block 134). In one embodiment, as shown in FIG. 2D, a thermal etch 260 by HCl (Hydro-Chloric Acid) or other thermal etch gas is performed to enlarge the wet etch recesses 252 to form enlarged recesses 262 with a third contour or shape in the pocket implant regions 220 of the substrate 200. In one aspect, as shown in FIG. 2D, the thermal etch is adapted to undercut one or more of the spacers 230 formed adjacent to the gate structures 210. In another aspect, the thermal etch is utilized as a pre-bake by HCl or other etch gas to etch the LDD area and self-align to the (110) plane. In still another aspect, the process parameters for HCl or other thermal etch gas may include 30~300 sccm, 500~900° C. temperature, H2 or N2 carrier gas, and 5~500 Torr.

Figure 2E:
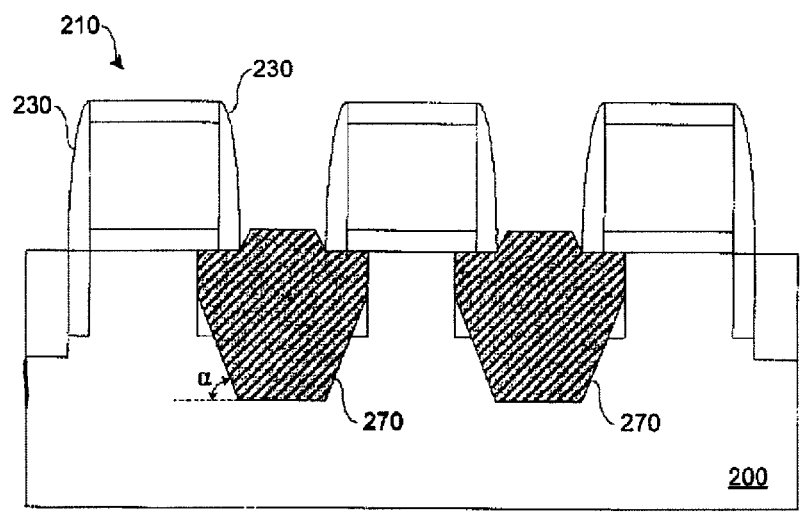

Referring to FIG. 1, source-drain structures are formed in the recesses of the substrate by deposition of a semiconductor material (block 138). In one embodiment, as shown in FIG. 2E, source-drain structures 270 are formed in the enlarged recesses 262 of the substrate 200 by deposition of a semiconductor material, such as Silicon-Germanium (SiGe). As shown in FIG. 2E, the source-drain structures 270 comprise the third contour or shape of the enlarged recesses 262. In one aspect, the source-drain structures 270 are formed by SiGe growth. In another aspect, proximity is controlled by thickness of spacers 230 and the dry ISO etch. In another aspect, an angle ($\alpha$), such as 54%, and (111) facet is controlled by TMAH etch. In another aspect, LDD area etch is controlled by pocket implant and thermal etch.

In one aspect, recess source drain shape comprises three plane, two (110) plane that are vertical to the channel, one (100) plane that is parallel to the channel, and two (111) plane that connects the (100) and (110) plane. In another aspect, device boosting is provided by the novel SSD profile due to a strain that is closer to the channel. Embodiments of the present disclosure utilize pre-bake of an epitaxial layer (EPI) deposition process and etching a self-aligned lightly doped drain (LDD) area to form the SSD profile.

In one aspect, embodiments of the present disclosure utilize the LDD area etch. As such, no LDD implant is utilized. LDD implant, like $BF_2$, suppresses HCl thermal etch rate. Thus, if LDD implant is not performed, then Si etch rate near the LDD area is increased.

In accordance with embodiments of the present disclosure, a method for providing a substrate, forming a gate structure on the substrate, forming a pocket implant region proximate to the gate structure, forming spacers adjacent to the gate structure, performing a dry etch to form a recess with a first contour, performing a wet etch to enlarge the recess to a second contour, performing a thermal etch to enlarge the recess to a third contour, and forming a source-drain structure in the recess having the third contour.

In various implementations, the substrate comprises Silicon (Si), the substrate includes at least one shallow trench isolation (STI) structure, and the gate structure includes a gate oxide layer, a poly-silicon (poly-Si) layer, and a mask layer. The pocket implant region comprises dopant material including at least one of Arsenic (As) and Phosphorus (P). The spacers are formed adjacent to and on either side of the gate structure, and the spacers comprise a dielectric material including at least one of Silicon-Nitride (SiN) and an oxide material. The dry etch comprises a dry isolation (ISO) etch that is performed to form the recess with the first contour in the pocket implant region of the substrate, and the recess with the first contour has a depth ranging from about 200 A to about 500 A. The wet etch comprises a wet etch by Tetra-Methyl-Ammonium Hydroxide (TMAH) that is performed to enlarge the recess formed by dry etching to form an enlarged recess with the second contour in the pocket implant region of the substrate, and the enlarged recess with the second contour has a depth ranging from about 400 A to about 800 A after TMAH etching is performed. The thermal etch comprises a thermal etch by HCl (Hydro-Chloric Acid) that is performed to enlarge the wet etch recess to form an enlarged recess with the third contour in the pocket implant region of the substrate, and the thermal etch is adapted to undercut the substrate adjacent the spacers. The source-drain structure is formed in the recess having the third contour by deposition of a semiconductor material including Silicon-Germanium (SiGe).

In accordance with embodiments of the present disclosure, a method for providing a substrate with defined gate structures, forming pocket implant regions proximate to the gate structures, forming spacers adjacent to and on either side of the gate structures to overlie the pocket implant regions, performing a dry etch on the substrate to form a recess with a first contour in the pocket implant regions, performing a wet etch on the recess to enlarge the recess to a second contour, performing a thermal etch on the enlarged recess to enlarge the enlarged recess to a third contour, and forming a source-drain structure in the enlarged recess having the third contour by depositing a semiconductor material including, for example, Silicon-Germanium (SiGe).

In accordance with embodiments of the present disclosure, a semiconductor device comprises a substrate with a gate structure formed thereon. The device includes spacers overlying opposite sidewalls of the gate structure. The device includes source-drain features in the substrate at either side of the gate structure. The source-drain features have upper sidewalls with a first facet and lower sidewalls with a second facet, wherein the first facet is different from the second facet. In one aspect, the substrate comprises Silicon (Si), and the source-drain features comprise Silicon-Germanium (SiGe). In another aspect, the first facet is <110>, and the second facet is <111>.

It should be appreciated that like reference numerals are used to identify like elements illustrated in one or more of the figures, wherein showings therein are for purposes of illustrating embodiments of the present disclosure and not for purposes of limiting the same.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A semiconductor device comprising:
   a substrate having a gate structure thereon, wherein the gate structure includes a gate electrode;
   spacers overlying opposite sidewalls of the gate structure;
   source-drain features in the substrate at either side of the gate structure, wherein the source-drain features includes a first source-drain having an upper sidewall with a first facet and a lower sidewall with a second facet, wherein the first facet is different from the second facet, wherein the upper sidewall with the first facet is directly under the gate electrode and wherein the first facet is <110>, wherein a portion of the lower sidewall with the second facet intersects the upper sidewall and is directly under the gate electrode, wherein the second facet is <111>;
   an n-type pocket implant region disposed in the substrate and physically contacting the portion of the lower sidewall with the second facet such that the n-type pocket implant region is directly under the gate electrode; and
   a channel region disposed in the substrate below the gate structure and physically contacting the gate structure, wherein the channel region is free of the n-type pocket implant region, wherein the channel region and the n-type pocket region are formed of the same semiconductor material.

2. The device of claim 1, wherein the source-drain features comprise Silicon-Germanium (SiGe).

3. The device of claim 1, wherein the substrate comprises Silicon (Si).

4. The device of claim 1, wherein the first source-drain feature further includes a bottom sidewall with a third facet that is different than the first and second facets.

5. The device of claim 1, wherein the n-type pocket implant region and the channel region are formed of silicon.

6. A device comprising:
   a gate stack disposed over a substrate, wherein the gate stack includes a gate electrode;
   a sidewall spacer disposed on a sidewall of the gate stack;
   an epitaxial source/drain feature disposed in the substrate adjacent the gate stack, wherein the epitaxial source/drain feature includes a first sidewall with a first facet, a second sidewall with second facet, and a third sidewall with a third facet, wherein the first, second, and third facets have different orientations from each other, wherein the first sidewall with the first facet is directly under the gate electrode and wherein the first facet is <110>, wherein a portion of the second sidewall with the second facet intersects the first sidewall and is directly under the gate electrode, wherein the second facet is <111>;
   an n-type pocket implant region disposed in the substrate and physically contacting the portion of the second sidewall with the second facet such that the n-type pocket implant region is directly under the gate electrode; and
   a channel region below the gate stack and physically contacting the gate stack, wherein the channel region is free of the n-type pocket implant region, wherein the channel region and the n-type pocket region are formed of the same semiconductor material.

7. The device of claim 6, wherein the n-type pocket implant region includes an edge that is aligned with the first sidewall.

8. The device of claim 7, wherein the first facet intersects the second facet at a first interface, and
   wherein the edge of the n-type pocket implant region extends from the first interface.

9. The device of claim 6, wherein the epitaxial source/drain feature further includes a fourth sidewall with a fourth facet, and
   wherein the fourth facet has the same orientation as the third facet.

10. The device of claim 9, wherein the fourth sidewall physically contacts the gate stack and the sidewall spacer.

11. The device of claim 6, wherein the third facet is <100>.

12. The device of claim 6, wherein the epitaxial source/drain feature includes SiGe.

13. The device of claim 6, further comprising a shallow trench isolation feature disposed in the substrate, wherein an edge of the shallow trench isolation feature is aligned with an outer edge of the sidewall spacer, the outer edge of the sidewall spacer facing away from the gate electrode.

14. A device comprising:
   a first gate stack and a second gate stack disposed over a semiconductor substrate, wherein the first gate stack includes a gate electrode;
   an epitaxial source/drain feature disposed in the semiconductor substrate between the first and second gate stacks, wherein the epitaxial source/drain feature physically contacts the first and second gate stacks, wherein the epitaxial source/drain feature includes a first sidewall with a first facet, a second sidewall with a second facet, and a third sidewall with a third facet, wherein the first, second, and third facets have different orientations from each other, wherein the first sidewall with the first facet is directly under the gate electrode and wherein the first facet is <110>, wherein a portion of the second sidewall with the second facet intersects the first sidewall and is directly under the gate electrode, wherein the second facet is <111>;
   an n-type pocket implant region disposed in the substrate and physically contacting the portion of the second sidewall with the second facet such that the n-type pocket implant region is directly under the gate electrode; and
   a channel region disposed in the substrate below the first gate stack and physically contacting the first gate stack, wherein the channel region is free of the n-type pocket implant region, wherein the channel region and the n-type pocket region are formed of the same semiconductor material.

15. The device of claim 14, wherein the n-type pocket implant extends along the second sidewall without extending to the first and third sidewalls.

16. The device of claim 14, wherein the first gate stack includes a first oxide layer and the second gate stack includes a second oxide layer, and
   wherein the epitaxial source/drain feature physically contacts the first and second oxide layers.

17. The device of claim 14, further comprising a dielectric sidewall spacer disposed over the first gate stack, wherein the epitaxial source/drain feature physically contacts the dielectric sidewall spacer.

18. The device of claim 14, wherein the first sidewall extends from a bottom surface of the gate stack and intersects the second sidewall, and wherein the second sidewall intersects the third sidewall.

19. The device of claim 14, wherein the epitaxial source/drain feature further includes a fourth sidewall with a fourth facet,
   wherein the fourth facet has the same orientation as the third facet, and
   wherein the fourth sidewall intersects the first sidewall.

20. The device of claim 14, further comprising a shallow trench isolation feature disposed in the semiconductor substrate; and
   a sidewall spacer disposed along a sidewall of the gate electrode, wherein an edge of the shallow trench isolation feature is aligned with an outer edge of the sidewall spacer, the outer edge of the sidewall spacer facing away from the gate electrode.

* * * * *